FAST SWITCHING DIODES

Filed June 23, 1961

INVENTOR
RICHARD L. ANDERSON

BY

ATTORNEY

Sept. 28, 1965 R. L. ANDERSON 3,208,887

FAST SWITCHING DIODES

Filed June 23, 1961 2 Sheets-Sheet 2

United States Patent Office 3,208,887
Patented Sept. 28, 1965

3,208,887

FAST SWITCHING DIODES

Richard L. Anderson, Madrid, Spain, assignor to International Business Machines Corporation, New York, N.Y., a corporation of New York Filed June 23, 1961, Ser. No. 119,111
2 Claims. (Cl. 148—33)

The present invention relates to a novel semiconductor diode structure. More particularly it relates to such a structure capable of switching between an "on" and "off" state in much shorter times than has heretofore been possible.

In modern electronic technology and in particular the computer field there is a continuing search for new devices that are functionally or in some other way superior to those presently used. Switching circuits as used in computers have long been the subject of a great deal of research. The speed of such switching circuits is of paramount importance since with a given number of circuits, the faster they operate, the more information they can process within an allowable period of time or conversely a smaller, cheaper machine can do a job previously requiring a more expensive and complicated one. Conventional p-n junction semiconductor diodes have long been used in such switching circuits, however, 1 microsecond is generally considered the lower time limit of switching with such diodes.

It is known that there are two principal factors inherent in a semiconductor diode which limit the frequency response and thus the minimum switching times obtainable. In such diodes the distance that a depletion region associated with a biased p-n junction travels into the semiconductor crystal is governed by the impurity distribution in that portion of the crystal being traversed. The effect of the depletion region in a semiconductor device gives to a circuit a parameter that is similar to capacitance, and further, the greater this capacitance the lower the frequency response of the device. In addition to the aforementioned capacitance there is another capacitance (diffusion capacitance) due to storage of minority carriers and this storage effect often limits the frequency response of junction diodes to considerably lower values of frequency. This effect consists of the temporary storage of injected excess minority carriers in the higher resistivity side of the junction. This storage effect in addition to contributing to capacity also causes time delays in pulse circuitry. A diode forwardly biased to conduction will thus not cut off completely until these minority carriers have migrated back to the junction or have been swept clear of the junction.

One prior attempt in the art to increase switching speed involved adding an extra electrode which was used to add an electric field in the vicinity of the junction to sweep away excess carriers.

Another method commonly used has been to degrade the carrier lifetime. This, however, results in the degradation of other characteristics such as an increased reverse current and is generally an unsatisfactory solution.

It is a primary object of the present invention to provide an exceptionally fast switching semiconductor p-n junction diode.

It is a further object to provide switching times in such a diode of less than one microsecond.

It is a further object to provide such a diode having a retrograde impurity distribution on at least one side of the p-n junction.

It is another object to provide such a diode having a critical resistivity ratio between the two sides of the junction.

It is a still further object to provide a method for making such a diode.

The foregoing and other objects, features and advantages of the invention will be apparent from the following more particular description of preferred embodiments of the invention, as illustrated in the accompanying drawings.

The objects of the invention are accomplished in general by a semiconductor device comprising a quantity of monocrystalline semiconductor material having two contiguous regions of "n" and "p" conductivity type determining impurities joined at a p-n junction wherein one of the regions has lower resistivity than the other and injects excess minority carriers into the other said device further having a retrograde impurity distribution in at least the region having the higher resistivity outside of the barrier or depletion region. Said device also has an overall resistivity ratio between the regions of at least five.

A retrograde distribution of impurities is defined as a distribution in which the density decreases as the distance from the junction increases.

It has been found that a p-n junction semiconductor device constructed in accordance with the above specifications is capable of switching from the "on" to the "off" condition within 30 millimicro (mμ.) seconds and further that even faster speeds are possible but that available measuring equipment has been limited to the above figure.

A semiconductor device utilizing a retrograde region within the barrier region to achieve a pronounced voltage-capacity effect is described in U.S. Patent 2,919,389 to W. Heywang et al., entitled, "Semiconductor Arrangement for Voltage Dependent Capacitance."

The explanation for the phenomenon is thought to be that the retrograde impurity distribution region sets up a drift field which sweeps the injected minority carriers out of the region of the junction rather than allowing them to migrate backwards to the junction which, as stated previously, is the usually accepted theory and which causes the rather slow decay of current through the device after the device has been switched from forward bias to reverse bias.

Figure 1:
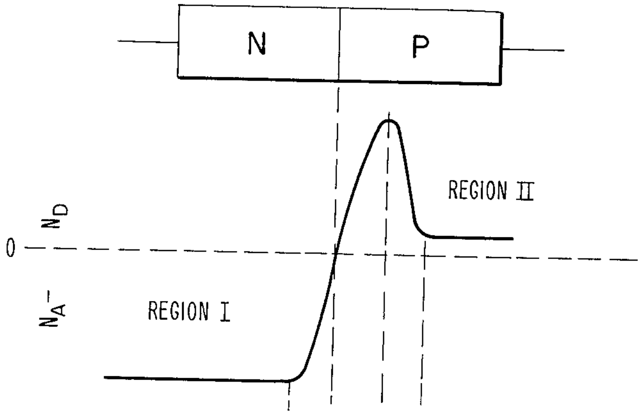
FIG. 1 is a schematic view of a semiconductor device containing a p-n junction accompanied by a dimensionally correlated graph of the impurity distribution therein.

Referring now more particularly to the drawings, FIG. 1 is a curve showing the conductivity type determining impurity distribution in the device. It will be noted that the curve crosses the zero impurity point at the junction and that the retrograde occurs at a finite distance away from the junction, said retrograde being mostly outside of the barrier or transistion region.

Figure 2:
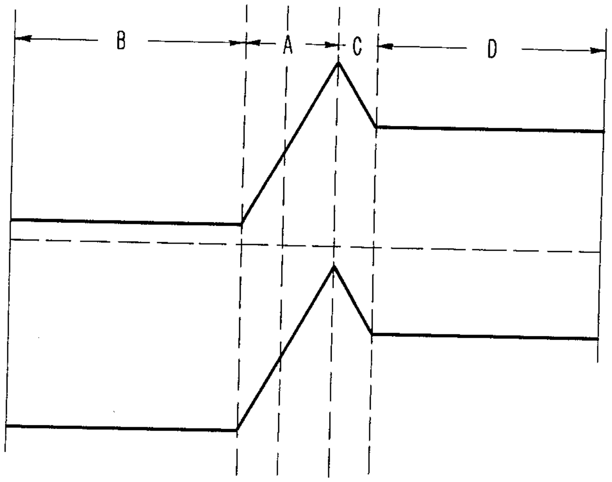
FIG. 2 is a dimensionally correlated energy level diagram of the p-n junction device of FIG. 1.

FIG. 2 is a conventional energy band diagram for the device of FIG. 1. It will be noted that peaks appear in both the valence and conduction bands adjacent to the retrograde region. Referring specifically to this figure in which the zones A, B, C and D are shown the operation of the device will be more apparent.

Electrons are injected from region B past transition or barrier region A into region C which is the retrograde impurity region. The electrostatic drift field which is set up by the retrograde distribution sweeps the electrons to the right and away from the junction.

When a normal diode is reverse biased, the injected carriers migrate back to the junction and are swept back to region B thus contributing to current. However, in the present device, this time is decreased since the electrons have to climb a barrier (C) to reach the junction and therefore negligibly few do so.

Now there will also be a current due to holes injected from D into B but if the resistivity in D is sufficiently higher than in B, the hole current will be negligible. It has been found that the resistivity of the region D should be at least five times greater than B to reduce the hole current to said negligible value. Or alternatively if both sides have a retrograde, then there is no problem about keeping any resistivity ratio, and there would be no storage effect for either electrons or holes since the retrograde on the "n" side of the junction would set up a drift field to sweep injected holes away from the junction.

Now the larger the retrograde the smaller the diffusion capacitance and the less storage effect.

The larger the resistivity ratio is, when only one retrograde is used, the less "opposite type carriers" are available to give rise to the storage effect.

The term "overall resistivity ratio" as used herein refers to the ratio of the resistances of the semiconductor materials outside of the space charge or barrier region, i.e., in the zones B and D of the drawings. It is, of course, to be understood that the resistivity will be lower immediately adjacent the contact regions.

Figure 3:
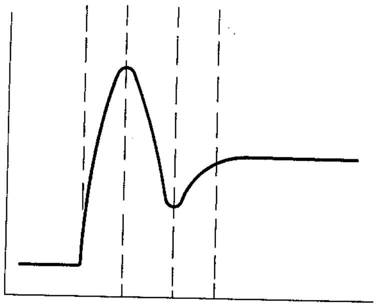
FIG. 3 is a dimensionally correlated resistivity diagram of the device of FIG. 1

FIG. 3 is a plot of resistivity versus distance dimensionally correlated to the plots of FIGS. 1 and 2. The curve follows what would be expected from the $N_D-N_A$ doping level plot of FIG. 1. Thus on the "n" side of the junction where the doping level is relatively high and uniform the resistivity is low and as the junction is approached the resistivity plot reaches a peak value and decreases to a null point corresponding with the maximum "p" doping level at a point outside of the barrier zone A. Then as the retrograde begins the resistivity increases and then levels out. It will be noted that the overall resistivity of the "p" region is approximately five times that of the "n" region which as stated previously has been found to be an optimum value to minimize "hole current." A retrograde can also be incorporated in the "n" region to further reduce the effect of the injected "hole current."

Retrograde impurity distributions may be placed in a semiconductor crystal by the technique of epitaxial vapor growth wherein a compound of a transport element and the semiconductor is decomposed to deposit the semiconductor material on a substrate. The general technique of epitaxial vapor growth is described in a number of articles in the IBM Journal of Research and Development, vol. 4, No. 3, July 1960, and the variable capacitance is described on pages 264–268 of the issue in an article entitled "A Vapor Grown Variable Capacitance Diode."

It has further been found that retrograde impurity distribution p-n junction structures may be vapor grown having the superior characteristics set forth above where certain steps are taken in accordance with the invention during the vapor growth operation.

Figure 4:
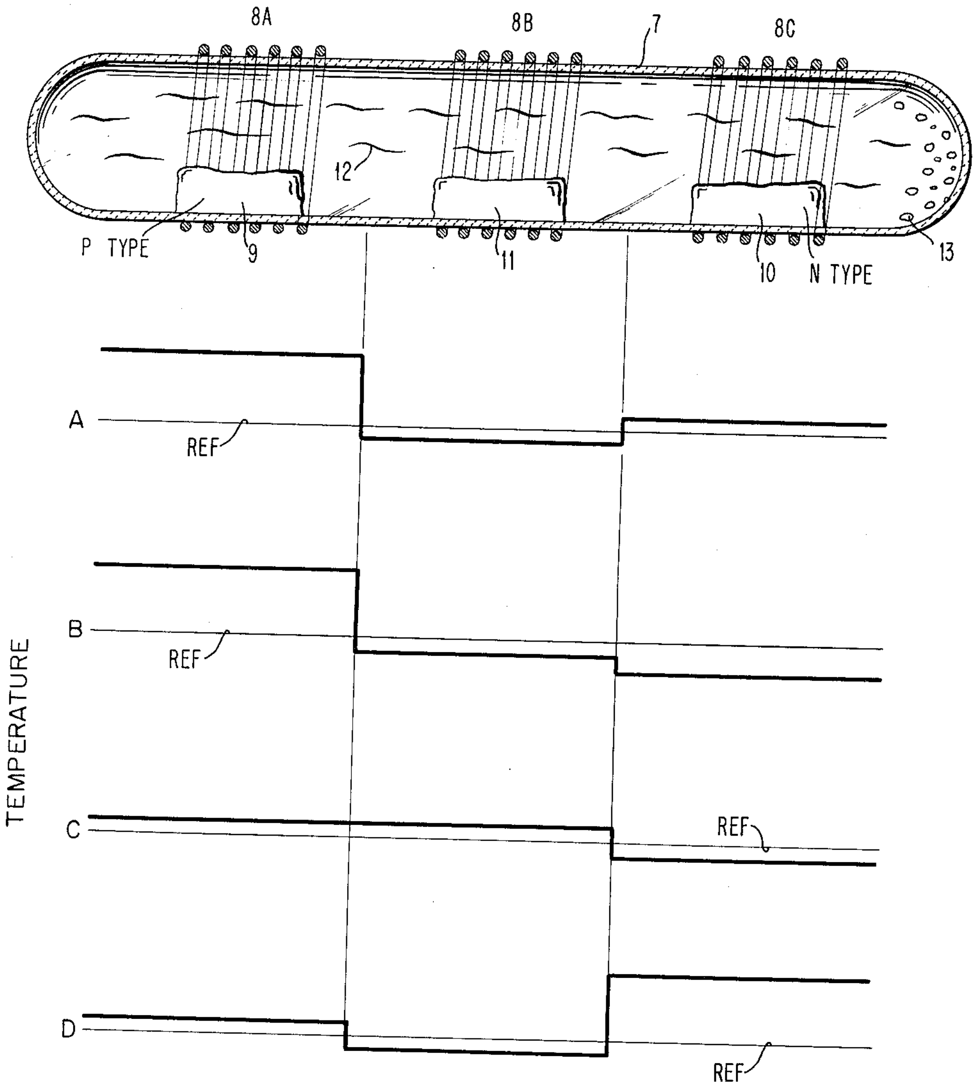
FIG. 4 is a schematic view of one form of apparatus with a dimensionally correlated temperature graph therefor capable of producing a retrograde impurity distribution and a critical resistivity ratio in a p-n junction semiconductor device in accordance with the invention.

Referring now to FIG. 4, in accordance with the invention, a diagrammatic structural diagram of one form of apparatus suitable for carrying out the vapor deposition process is shown and the temperature profile maintained in connection therewith is provided. In FIG. 4, an environment controlling sealed tube 7, such as quartz, is provided with a series of heating elements 8A, 8B, and 8C for example, of the resistance type involving Nichrome wire, which are capable of heating and controlling the temperature in discrete stations of the tube 7. A quantity of a "p" conductivity type source semiconductor material, for example germanium 9, is positioned in the region controlled by heating element 8A. A quantity of an "n" conductivity type germanium 10 is positioned in the region controlled by heating element 8C, and a substrate of monocrystalline semiconductor material 11 is positioned under heating element 8C. A quantity of a transport element, for example iodine, is introduced into the container 7 and in the intermediate stage of the deposition illustrated, the transport element enters a vapor 12 of the transport element and the particular source 9 or 10 being deposited.

In carrying out the process, the chemical reaction within the tube 7 is such that by appropriate application of power to the various heating elements 8A through 8C, the entire tube 7 is raised to a reference temperature and the temperature is further selectively raised under the source semiconductor materials 9 and 10 while the substrate 11 is held at a temperature at which pyrolytic decomposition of the gas 12 occurs, which for the chemical reaction $2GeI_2 \rightleftarrows GeI_4 + Ge$ is the lowest temperature in the container 7. The temperature profile in the tube 7 for the deposition of the "p" type source 9 on the substrate 11 using germanium and iodine is indicated by the curve A illustrating the source 9 being maintained at a temperature substantially above reference, the "n" type source 10 is maintained slightly above reference and the temperature under the substrate 11 is at the lowest temperature.

Under these conditions, the heated "p" type source semiconductor material 9 and the heated transport element will vaporize and form a gaseous compound 12. At a selected point, illustrated for germanium and iodine as the lowest temperature point, which is at the substrate 11, the compound 12 of the source 9 and the transport element will decompose and epitaxially deposit "p" conductivity type semiconductor material on the substrate.

Upon reaching a desired physical size for a portion of the region 1 of FIG. 1, a change in the temperature profile, such as shown in curve B of FIG. 4 is employed.

In accordance with curve B, the temperature of the source 9 is maintained sufficiently high to continue the deposition and the temperature under the source 10 is established at a small increment below that of the substrate 11. Under these conditions a small amount of a solid impurity bearing material 13 will condense in the region of the source 10. This material is shown in granular form on the walls of the container 7.

The reaction is next permitted to come to an equilibrium in which no significant deposition occurs by setting up a temperature profile as shown in connection with curve C wherein the source 9 and the substrate 11 are maintained at a temperature near reference and the region of the source 10 is maintained at a temperature slightly below reference to insure that the material 13 will remain solid.

Upon reaching an equilibrium, the temperature is raised under the source 10, as illustrated in curve D of FIG. 4 such that the source 9 is maintained slightly above reference, the substrate 11 is maintained slightly below reference at the lowest temperature point in the system to insure that the deposition will occur at that point and the temperature under the source 10 is raised to a substantial value above reference.

While the temperature of the source 10 is going up, the condensed solid impurity bearing material 13 in the vicinity of the source 10 which was placed there in connection with curve B of FIG. 4 evaporates before the opposite conductivity type impurity concentration present in the source 10 becomes effective to predominate in the growing crystal 11 and to control conductivity type. Thus, after the steady impurity concentration in the crystal being grown on the substrate 11 as the temperature rises, a different level of impurity concentration can occur with increasing concentration until the opposite conductivity type impurity predominates.

When a change of temperature profile as illustrated from curve A to curve D is accomplished in setting up the vapor growth of one conductivity type semiconductor material after a previous deposition of the opposite conductivity type on the substrate 11, the unique and useful effect of the invention occurs. It has been found that there is an initial rise in the quanity of the conductivity type determining impurity being deposited. This effect is illustrated in FIG. 1 for a deposition of "p" conductivity type material shown on the right side of the curve followed by a deposition of "n" conductivity type material wherein there is a rise in the number of acceptors over the number of donors to a turnover point A beyond which there is a decrease in the number of acceptors and increase in the number of donors until the number of donors equals the number of acceptors at which point a p-n junction 4 is formed, and further "n" material such as shown in the "n" region 1 of FIG. 1 is deposited as the number of donors continues to increase. This initial increase in the concentration of the conductivity type determining impurities before a decrease when a change in conductivity type is desired produces a retrograde impurity distribution in the deposited crystal.

It will be apparent that the deposition operation providing the retrograde impurity distribution of the invention may be reversed as soon as the junction is formed so as to provide a retrograde distribution on both sides of a junction which was discussed previously. In other words, by reversing the order and conductivity type of the temperature profiles a distribution identical to the one shown on the "p" condctivity side on FIG. 1 may be provided on the "n" conductivity side. This is accomplished in accordance with the invention by setting up the temperature profile the opposite of that of curve B, then curve C, then curve A as soon as the junction is formed. The structure formed by such a vapor growth operation results in a retrograde distribution on both sides of the junction and this structure will be bilateral and will be substantially more sensitive to the sweeping effect of the drift field set up by the retrograde on the injected carriers.

In order to aid in understanding and practicing the invention, the following set of actual specifications is set forth to provide a starting place in a complicated technology for one skilled in the art. It being understood, however, that this set of specifications is provided by way of example only.

A retrograde impurity distribution in accordance with the invention may be produced in a single semi-conductor crystal by providing, in connection with FIG. 4, a quartz tube 7 of 22 millimeters inside diameter and 30 centimeters in length, having positioned, in discrete heat controllable locations therein corresponding to elements 8A, 8B and 8C, respectively, the following items.

*In location 8C.*—Arsenic doped germanium 0.01 to 0.03 ohm centimeter resistivity—ingot form—approximately 0.3 cubic inch.

*In location 8B.*—A monocrystalline germanium substrate—"p" conductivity type, approximately 0.002 ohm centimeter resistivity—0.020 inch square, 0.005 inch thick.

*In location 8A.*—Gallium doped germanium 0.1 ohm centimeter resistivity—ingot form—approximately 0.3 cubic inch.

The tube 7 is evacuated to $10^{-5}$ mm. Hg. with 75 milligrams of iodine inserted.

The temperature profile described by the curve A for the vapor growth of "p" conductivity type germanium on the substrate 11 is such that element 9 is maintained at approximately 550°, the substrate 11 is maintained at about 420° C., and the "n" conductivity type source is at approximately 425° C.

This is maintained for a time sufficient to grow a portion of the region 1 of FIG. 1 and may be from 1 to 50 hours dependent on the growth rate. The temperature profile described by the curve B for the deposition of the solid impurity bearing material 13 in the region of the "n" conductivity type germanium 10 is such that the element 10 is at approximately 415° C. while substrate 11 is maintained at about 420° C. and the element 9 remains at about 550° C. This profile is maintained until a sufficient solid impurity bearing material 13 is deposited to provide the retrograde junction. This is related to the size of the tube 7 and for the size in this example, approximately 1 hour is appropriate.

The temperature profile described by the curve C provides an intermediate cooling step. In this step the region containing the solid impurity bearing material 13 is maintained sufficiently below the remainder of the system to prevent return to the vapor 12. This cooling step may be maintained until equilibrium is established which may be for approximately 1 hour.

The temperature profile described by the curve D provides the retrograde impurity distribution. As the temperature under the region 10 rises, the solid impurity bearing material 13 is driven into the vapor 12. This operates to raise the concentration of the gallium in the vapor 12 before the arsenic from the source 10 reaches a concentration high enough to predominate. The more slowly the temperature rises, the larger will be the physical distance from the junction to the peak of the retrograde distribution. The temperature of the region 10 is brought up to the temperature of curve D in approximately 15 minutes and growth is continued until a region 2 as shown in FIG. 1 of desired size is formed.

It will be apparent to one skilled in the art that various adjustments in actual temperature values will be advantageous compatible with the quantities used, the vapor pressures of the particular elements and the voltages to be handled by the ultimate structure. The important item is to set up a temperature profile that causes a pyrolytic decomposition of a compound of the source and the transport element in the vicinity of the substrate and during deposition, deposit impurity bearing material, establish equilibrium and then change the predominance of one conductivity type determining impurity over the other. As a result of this change in accordance with the invention, the concentration of the impurity being deposited will first increase then decrease toward a junction thereby producing a retrograde impurity distribution.

While the invention has been particularly shown and described with refrence to preferred embodiments therof, it will be understod by those skilled in the art that the foregoing and other changes in form and details may be made therein without departing from the spirit and scope of the invention.

What is claimed is:

1. A fast switching p-n junction semiconductor diode having a body of monocrystalline semiconductor material comprising a first region containing a first extrinsic conductivity type determining impurity establishing a first value of resistivity throughout a first portion of its volume, said resistivity increasing to a maximum at the junction, and a second region of opposite extrinsic conductivity type semiconductor material contiguous with said first region and establishing the p-n junction wherein the impurity concentration first increases and then decreases with increasing distance from the junction after a maximum point just outside of the transistor region for setting up a drift field therein to sweep injected excess minority carriers away from the junction when the device is reverse biased and wherein the impurity concentration of the second region levels off at a point removed from said maximum to establish an overall resistivity in said second region of at least five times the overall resistivity of the first region.

2. A fast switching p-n junction semiconductor diode comprising a body of monocrystalline semiconductor material having two contiguous regions containing "n" and "p" conductivity type determining impurities joined at a p-n junction wherein the conductivity type determining impurity concentrations in both regions is substantially zero at the junction and first increase to a maximum and then decrease with increasing distance from said junction said maximum being at a point just outside of the transition region said impurity concentrations being effective for setting up a drift field in that portion of each region for sweeping injected excess minority carriers away from the junction when the device is reverse biased.

References Cited by the Examiner

UNITED STATES PATENTS

| | | | |
|---|---|---|---|
| 2,810,870 | 10/57 | Hunter et al. | 148—1.5 X |
| 2,864,729 | 12/58 | Seiler | 148—33 X |
| 2,900,286 | 8/58 | Goldstein | 148—1.5 |
| 2,919,389 | 12/59 | Hey wang et al. | 148—1.5 |

DAVID L. RECK, *Primary Examiner.*

RAY K. WINDHAM, *Examiner.*